(12) United States Patent
Chen et al.

(10) Patent No.: US 10,729,013 B2
(45) Date of Patent: Jul. 28, 2020

(54) SEMI-FINISHED PRODUCT FOR THE PRODUCTION OF CONNECTION SYSTEMS FOR ELECTRONIC COMPONENTS AND METHOD

(71) Applicant: AT&S (CHINA) CO., LTD., Shanghai (CN)

(72) Inventors: Peiwang Chen, Shanghai (CN); Nikolaus Bauer-Oppinger, Shanghai (CN)

(73) Assignee: AT&S (CHINA) (CO., LTD., Shanghai (CN)

( * ) Notice: Subject to any disclaimer, the term of this patent is extended or adjusted under 35 U.S.C. 154(b) by 16 days.

(21) Appl. No.: 15/311,297

(22) PCT Filed: May 14, 2015

(86) PCT No.: PCT/CN2015/078971
§ 371 (c)(1),
(2) Date: Nov. 15, 2016

(87) PCT Pub. No.: WO2015/172729
PCT Pub. Date: Nov. 19, 2015

(65) Prior Publication Data
US 2017/0079145 A1 Mar. 16, 2017

(30) Foreign Application Priority Data
May 16, 2014 (CN) .................... 2014 2 0253307 U

(51) Int. Cl.
*H05K 3/02* (2006.01)
*H05K 3/00* (2006.01)
(Continued)

(52) U.S. Cl.
CPC ......... *H05K 3/025* (2013.01); *B29C 66/0326* (2013.01); *B29C 66/45* (2013.01);
(Continued)

(58) Field of Classification Search
CPC .... H05K 3/007; H05K 3/0097; H05K 3/4682; H05K 2203/1536; H05K 2203/0156
See application file for complete search history.

(56) References Cited

U.S. PATENT DOCUMENTS

2001/0027875 A1* 10/2001 Kim ..................... H05K 3/4623
174/255
2008/0202661 A1* 8/2008 Kobayashi .......... H01L 21/4857
156/50
(Continued)

FOREIGN PATENT DOCUMENTS

| CN | 203206578 U | 9/2013 |
|---|---|---|
| CN | 204014250 U | 12/2014 |
| JP | 2010239010 A * | 10/2010 |

OTHER PUBLICATIONS

Machine translation of JP 2010/239010, obtained from Jplatpat service of the JPO (Year: 2018).*

(Continued)

*Primary Examiner* — Z. Jim Yang
(74) *Attorney, Agent, or Firm* — Eversheds Sutherland (US) LLP

(57) ABSTRACT

A semi-finished product for the production of connection systems for electronic components comprises two groups (A, B) of alternately applied conductive layers and insulating layers, wherein outer layers (2, 2') of the two groups (A, B) are facing each other to form a separation area for the groups (A, B) to be separated from each other to yield connection systems for electronic components and the separation area is overlapped and sealed on all sides thereof at least by the two insulating layers (4, 4') following the separation area. The method for the production of connection systems for electronic components is characterized by the following steps: a) orienting two groups (A, B) of alternately applied conductive layers and insulating layers (Continued)

Figure 1A:
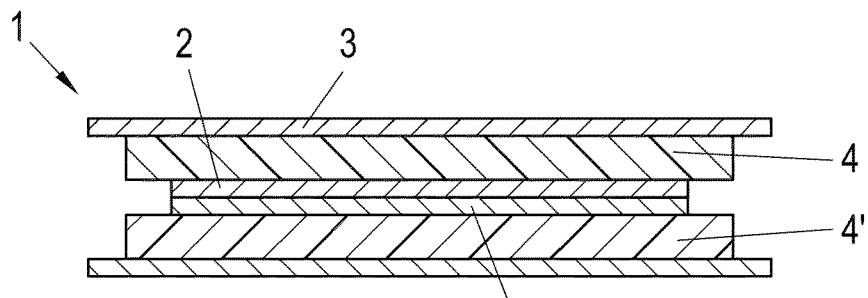

(4, 4') to face each other with outer layers to form a separation area for the groups (A, B) to be separated from each other and safeguarding that the separation area is overlapped and sealed on all sides thereof at least by the two insulating layers (4, 4') following the separation area, b) processing the groups (A, B) of alternately applied conductive layers and insulating layer, c) cutting through the separation area along the edges thereof.

12 Claims, 3 Drawing Sheets

(51) Int. Cl.
*H05K 3/46* (2006.01)
*B29C 65/00* (2006.01)
*B29K 679/00* (2006.01)
*B29K 705/02* (2006.01)
*B29L 31/34* (2006.01)

(52) U.S. Cl.
CPC ........... *H05K 3/007* (2013.01); *H05K 3/0097* (2013.01); *H05K 3/4682* (2013.01); *B29K 2679/08* (2013.01); *B29K 2705/02* (2013.01); *B29K 2995/0005* (2013.01); *B29K 2995/0007* (2013.01); *B29L 2031/3425* (2013.01); *H05K 2203/0156* (2013.01); *H05K 2203/1536* (2013.01)

(56) References Cited

U.S. PATENT DOCUMENTS

| | | | |
|---|---|---|---|
| 2010/0006334 A1* | 1/2010 | Takenaka | H05K 3/465 174/262 |
| 2010/0147559 A1* | 6/2010 | Kim | H05K 3/0097 174/250 |
| 2010/0232127 A1* | 9/2010 | Mori | H01L 23/49822 361/783 |
| 2010/0319966 A1* | 12/2010 | Liu | H05K 3/4682 174/255 |
| 2012/0279630 A1* | 11/2012 | Chuang | H05K 3/0097 156/48 |
| 2012/0280022 A1 | 11/2012 | Huang | |
| 2013/0083503 A1* | 4/2013 | Lai | H01L 23/49827 361/783 |
| 2015/0143694 A1* | 5/2015 | Lee | H05K 3/4682 29/846 |
| 2015/0257253 A1* | 9/2015 | Lee | H05K 1/028 428/40.9 |
| 2015/0296618 A1* | 10/2015 | Huang | H05K 3/007 361/771 |
| 2016/0113120 A1* | 4/2016 | Ishihara | H05K 3/0097 174/262 |
| 2016/0120060 A1* | 4/2016 | Kim | H05K 3/4038 361/720 |
| 2017/0021605 A1* | 1/2017 | Shankar | B32B 38/10 |
| 2017/0069521 A1* | 3/2017 | Sugo | C08G 77/20 |
| 2017/0181293 A1* | 6/2017 | Weidinger | H05K 1/185 |
| 2018/0255649 A1* | 9/2018 | Tay | H05K 3/4007 |
| 2019/0169471 A1* | 6/2019 | Moore | C09J 9/00 |

OTHER PUBLICATIONS

PCT International Search Report for International Application No. PCT/CN2015/078971 dated Jul. 14, 2015.

* cited by examiner

SEMI-FINISHED PRODUCT FOR THE PRODUCTION OF CONNECTION SYSTEMS FOR ELECTRONIC COMPONENTS AND METHOD

BACKGROUND OF THE INVENTION

Field of the Invention

The present invention relates to a semi-finished product for the production of connection systems for electronic components and a method for producing connection systems for electronic components.

Description of the Related Art

In the context of the present invention, the term "connection system for electronic components" encompasses printed circuit boards, also referred to as printed wire boards, substrates and the like, which are altogether panels carrying and electrically connecting electronic components such as microchips, transistors, LEDs etc. and, hence, form vital parts of all kinds of electronic products like (tablet) computers, smartphones and the like. For the sake of simplicity, the following description is directed to printed circuit boards only, the person skilled in the art will, however, appreciate that every aspect of the invention and the following description is applicable also to substrates as just described and defined. Printed Circuit boards have a more or less complex structure depending on the specific application. In general a printed circuit board has a plurality of alternately applied conductive and insulating layers wherein the conductive layers are bonded together by hardening panels or plies of glass fibers impregnated with organic resin, said panels forming the insulating layers. Such panels for use in the production of printed circuit boards are widely known in the industry as "prepregs" (preimpregnated fibers), which are delivered and processed in an uncured, hence viscous state of the organic resin. The actual insulating layer results when the organic resin has cured. The insulating layers carry conductive layers, for example formed of copper foil, the conductive layers being appropriately processed to form wirings to electrically connect the electronic components. Modern printed circuit boards allow for a high degree of integration of electronic components and their appropriate wiring. In the technical field of printed wire boards, substrates are known to offer a similar functionality in terms of alternately applied conductive and insulating layers, however, substrates are much smaller and often serve to connect a microchip to a printed circuit board. To this end, the insulating layers of substrates are often produced of glass or ceramic materials which allows for smaller, high-precision structures.

There is, however, a constant need for further miniaturization in the electronic industry in order to provide consumers and professionals with ever smaller yet more capable electronic devices and installations which require more electronic components to be packaged and wired in a smaller space. Many electronic components, nowadays, are produced in nanometer-scale so that very often the printed circuit boards or substrates carrying and connecting the electronic components are the limiting parts in terms of miniaturization of electronic devices. The conductive layers and insulating layers making up a printed circuit board cannot easily be made thinner, since the bonding of the layers, which is often carried out by laminating layer after layer requires a certain mechanical stability in order to prevent undulating or even tearing of the bonded layers under the mechanical stresses that arise during lamination. Moreover, when the thickness of the layers falls below a certain limit, the handling of the very thin material previous to processing becomes increasingly critical due to buckling of the materials.

There have been attempts to combine groups of alternately applied conductive layers and insulating layers forming printed circuit boards on a carrier layer in order to have a combined thickness of the very thin boards to be produced so that the above described problems of buckling and tearing can be avoided or alleviated. There was, however, a problem with these attempts insofar as the groups of conductive layers and insulating layers, hence, the future printed circuit boards tended to skid and swim on the carrier layer during lamination. Moreover, it was detrimental that during production chemicals could leak into the area of the carrier layer, which was undesirable as those chemicals promoted undesirable etching of conductive layers in the region of the separation area. Furthermore, the chemicals in the separation area were carried into different chemical stages in the production line, so that those chemicals were prematurely contaminated and eventually spent.

SUMMARY

To be able to produce even thinner printed circuit boards the invention is thus directed to a semi-finished product for the production of connection systems for electronic components and a method for producing connection systems for electronic components that avoid the above described limitations and drawbacks. In particular, the invention is directed to a method of preventing skidding and swimming as described above without the need to deploy additional material such as glue or the like to prevent skidding.

DETAILED DESCRIPTION

In particular the invention provides for a semi-finished product for the production of printed circuit boards, the semi-finished product comprising two groups of alternately applied conductive layers and insulating layers, wherein outer layers of the two groups are facing each other to form a separation area for the groups to be separated from each other to yield connection systems for electronic components, characterized in that the separation area is overlapped and sealed on all sides thereof at least by the two insulating layers following the separation area. By this overlap and sealing of the separation area, the groups of conductive layers and insulating layers are closely held together during the processing steps necessary to further build conductive and insulating layers. The overlap is safeguarded also during production of wirings, vias and through holes by etching and drilling operations such as laser drilling. Leaking of chemicals into the separation area is effectively prevented during these stages of production. The inventive semi-finished product can easily be finished to the desired product when the semi-finished product is cut to remove the overlap so that the groups of conductive layers and insulating layers fall apart from each other along the separation area to yield the final product.

The outer layers of the two groups facing each other and thus forming the separation area for the two groups to be separated from each other can, in principle, be all sorts of layers or plies making up a printed circuit board. However, it is preferred that the outer layers facing each other are conductive layers. Conductive layers are generally made of metal foils such as copper foils and as such do not tend to stick to each other. Thus, the provision of conductive layers on the outer sides of the groups automatically leads to a separation area as intended by the present invention without the need for a specific separation layer to promote separation of the two groups from each other to yield printed circuit boards, or more generally speaking to yield connection systems for electronic components.

In the event, however, when the outer layers of the groups facing each other are insulating layers which in the context of the present invention usually are layers or plies of reinforced organic resin, it is preferred that at least one separation layer of polyimide-foil is arranged in the separation area. Polyimide-foil will not stick to the organic polymers of regular insulating layers used in the art of producing printed circuit boards and allows for easy separation of the two groups in the separation area.

Preferably, the insulating layers are made from prepreg-material, preferably FR-4-material.

While it is possible to carry out the present invention just by arranging two groups in such a manner that outer layers thereof face each other and thereby to increase the overall thickness of the semi-finished product in order to obtain the above discussed advantages, it can be useful if a carrier layer is arranged between the outer layers facing each other. Such a carrier layer can be chosen to prevent adhesion of the outer layers of the two groups facing each other to one another on the one hand and on the other hand to further increase thickness, stiffness and rigidity of the semi-finished product to further improve handling of the semi-finished product during manufacture of the printed circuit boards.

Preferably, the carrier layer is made of a material chosen from the group consisting of a prepreg-material and an aluminum sheet.

In this context it is preferred that the carrier layer is a layer of expired or partly hardened prepreg-material, which material usually can be found in abundance on production sites of printed circuit boards.

According to a preferred embodiment of the present invention, the carrier layer has a thickness between 500 µm and 50 µm, preferably between 150 µm and 100 µm and further according to a preferred embodiment the insulating layers preferably have a thickness between 10 µm and 80 µm, preferably between 40 µm and 60 µm.

In order to allow for the electrical connection of the components to be arranged on or in the printed circuit board according to the present invention, it is preferred that at least one of the conductive layers is structured for connection of electronic components.

As stated above, buckling and bending of printed circuit boards during lamination or bonding is a common problem that always has to be taken into account during design and production of such boards. As a general rule, printed circuit boards have to be produced by symmetrical lamination processes, meaning that conductive layers and insulating layers are applied or laminated symmetrically on both sides of the printed circuit board leading to printed circuit boards having only even numbers of conductive layers. The production of printed circuit boards with uneven numbers of conductive layers is practically inadvisable due to the described problems with buckling and bending. Obviously, these phenomena will occur more readily when producing ultra-thin printed circuit boards as it is envisaged by the present invention. The combination of two groups of insulating layers and carrier layers in the inventive semi-finished product allows for the production of printed circuit boards having uneven numbers of conductive layers, when, in conformity with a preferred embodiment of the invention the groups of alternately applied conductive layers and insulating layers each are formed by an uneven number of conductive layers, particular three conductive layers separated by insulating layers. Once a composite having an uneven number of conductive layers is obtained and subsequently separated from the inventive semi-finished product, further lamination processes adding two layers in every symmetrical lamination step will always give an uneven number of conductive layers.

The present invention further relates to a method for the production of printed circuit boards which is characterized by the following steps:

a) orienting two groups of alternately applied conductive layers and insulating layers to face each other with outer layers to form a separation area for the groups to be separated from each other and safeguarding that the separation area is overlapped and sealed on all sides thereof at least by the two insulating layers following the separation area b) processing the groups of alternately applied conductive layers and insulating layers c) cutting through the separation area along the edges thereof.

By this overlap and sealing of the separation area, the groups of conductive layers and insulating layers are closely held together during the processing steps necessary to further build conductive and insulating layers. The overlap is safeguarded also during production of wirings, vias and through holes by etching and drilling operations such as laser drilling. Leaking of chemicals into the separation area is effectively prevented during these stages of production. The inventive method leads to the desired product when the semi-finished product is cut to remove the overlap so that the groups of conductive layers and insulating layers fall apart from each other along the separation area to yield the final product.

The outer layers of the two groups facing each other and thus forming the separation area for the two groups to be separated from each other can, in principle, be all sorts of layers or plies making up a printed circuit board. However, it is preferred that the outer layers facing each other are conductive layers. Conductive layer are generally made of metal foils such as copper foils and as such do not tend to stick to each other. Thus, the provision of conductive layers on the outer sides of the groups automatically leads to a separation area as intended by the present invention without the need for a specific separation layer to promote separation of the two groups from each other to yield printed circuit boards, or more generally speaking to yield connection systems for electronic components.

In the event, however, when the outer layers of the groups facing each other are insulating layers which in the context of the present invention usually are layers or plies of reinforced organic resin, it is preferred that at least one separation layer of polyimide-foil is arranged in the separation area. Polyimide-foil will not stick to the organic polymers of regular insulating layers used in the art of producing printed circuit boards and allows for easy separation of the two groups in the separation area.

Preferably, the insulating layers are made from prepreg-material, in particular FR-4-material.

While it is possible to carry out the present invention just by arranging two groups in such a manner that outer layers thereof face each other and thereby to increase the overall thickness of the semi-finished product in order to obtain the above discussed advantages, it can be useful if a carrier layer is arranged between the outer layers facing each other. Such a carrier layer can be chosen to prevent adhesion of the outer layers of the two groups facing each other to one another on the one hand and on the other hand further to increase thickness, stiffness and rigidity of the semi-finished product to further improve handling of the semi-finished product during manufacture of the printed circuit boards.

Preferably, the carrier layer is made of a material chosen from the group consisting of a prepreg-material and an aluminum sheet.

In this context it is preferred that the carrier layer is a layer of expired or partly hardened prepreg-material, which material usually can be found in abundance on production sites of printed circuit boards.

According to a preferred embodiment of the present invention, the carrier layer has a thickness between 500 μm and 50 μm, preferably between 150 μm and 100 μm and further according to a preferred embodiment the insulating layers preferably have a thickness between 10 μm and 80 μm, preferably between 40 μm and 60 μm.

In order to allow for the electrical connection of the components to be arranged on or in the printed circuit board according to the present invention, it is preferred that at least one of the conductive layers is structured for connection of electronic components.

As stated above, buckling and bending of printed circuit boards during lamination or bonding is a common problem that always has to be taken into account during design and production of such boards. As a general rule, printed circuit boards have to be produced by symmetrical lamination processes, meaning that conductive layers and insulating layers are applied or laminated symmetrically on both sides of the printed circuit board leading to printed circuit boards having only even numbers of conductive layers. The production of printed circuit boards with uneven numbers of conductive layers is practically inadvisable due to the described problems with buckling and bending. Obviously, these phenomena will occur more readily when producing ultra-thin printed circuit boards as it is envisaged by the present invention. The combination of two groups of insulating layers and carrier layers in the inventive method allows for the production of printed circuit boards having uneven numbers of conductive layers, when, in conformity with a preferred embodiment of the invention the groups of alternately applied conductive layers and insulating layers each are formed by an uneven number of conductive layers, particular three conductive layers separated by insulating layers. Once a composite having an uneven number of conductive layers is obtained and subsequently separated from the inventive semi-finished product, further lamination processes adding two layers in every symmetrical lamination step will always give an uneven number of conductive layers.

Figure 2:
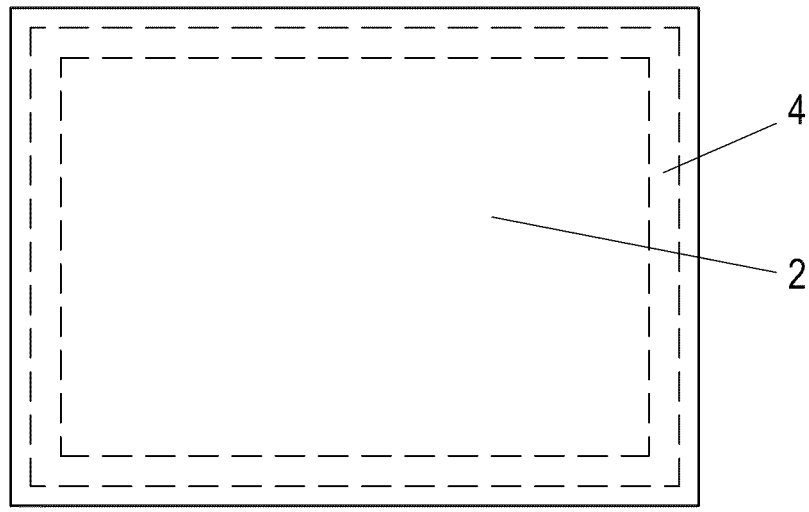
Figure 3:
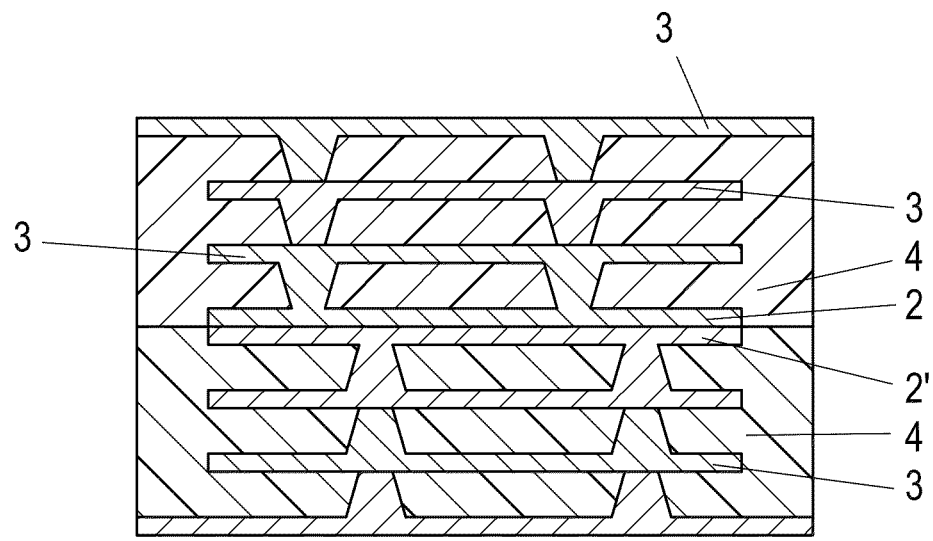
Figure 4:
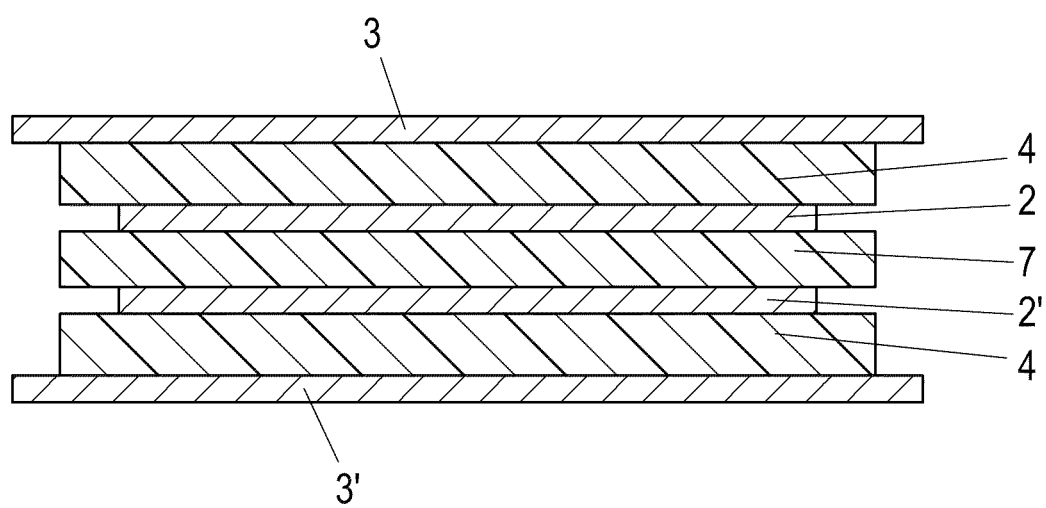

In the following the present invention will be exemplified in more detail by reference to the drawings in which FIGS. 1a)-1g) show exemplary steps of the inventive method using the semi-finished product according to the present invention;

FIG. 2 shows a plan view of one group of conductive and insulating layers wherein an outer layer of the group is overlapped by an insulating layer and FIG. 3 shows an exemplary semi-finished product according to the invention; and FIG. 4 shows a preferred embodiment of the present invention.

Obviously, the semi-finished product according to the invention is symmetrical about the separation area arranged between the two groups of alternately applied conductive layers and insulating layers. Wherever possible, the following description will avoid describing both groups of the semi-finished product. It is, however, obvious to the person skilled in the art that this description and the corresponding reference numerals also apply to the other side or the other group of alternately applied conductive layers and insulating layers of the semi-finished product of this invention.

Figure 1B:
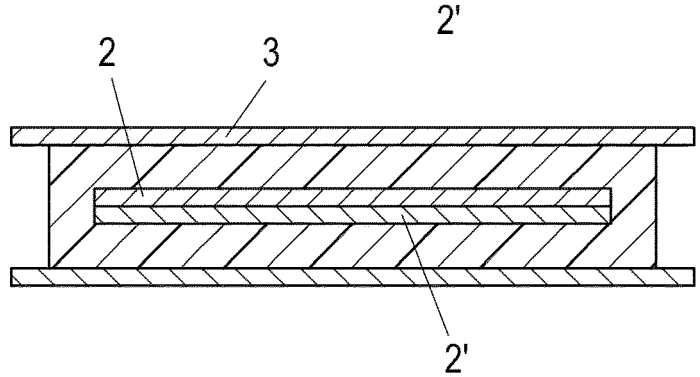
Figure 1C:
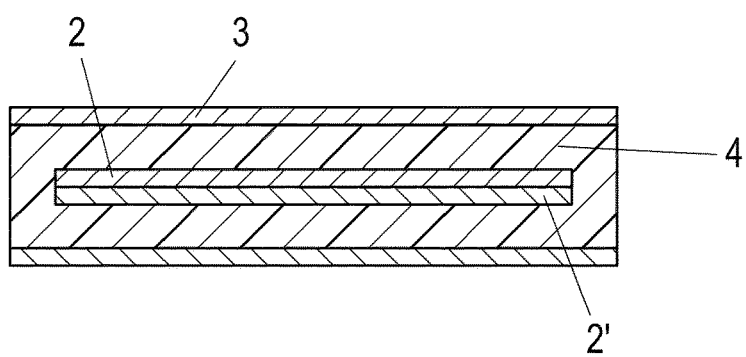
Figure 1D:
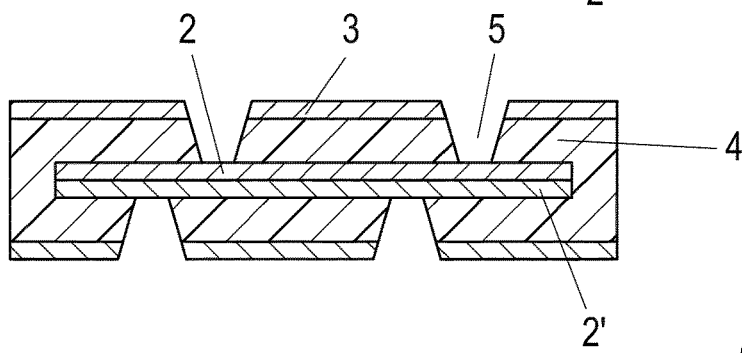

In FIG. 1a) a group of alternately applied conductive layers and insulating layers is denoted by reference numeral 1. In this particular case, the group 1 consists of outer layers 2 and 3 and an inner layer 4. The outer layers 2 and 3 of the group 1 in this case are conductive layers, for example of copper foil. The inner layer 4 is an insulating layer, for example of prepreg-material, such as FR-4-material. Since the outer layer 2 does not stick to the outer layer 2' of the second group of alternately applied conductive layers and insulating layers facing it, a separation area is formed between the two groups of alternately applied conductive layers and insulating layers the separation area extending between the outer layers 2 and 2' facing each other. As can be seen in FIG. 1a) the separation area is overlapped by the two insulating layers 4 and 4', so that upon lamination, which means application of heat and pressure, the inventive semi-finished product is formed by the resin of the insulating layers 4 and 4' sealing the separation area between the outer layers 2 and 2' on all sides thereof as can be seen in FIG. 1b). FIG. 1b) thus shows the inventive semi-finished product. In the step according to FIG. 1c), the semi-finished product according to FIG. 1b) is dressed. Subsequently, holes 5 are drilled, preferably by laser drilling (FIG. 1d)).

Figure 1E:
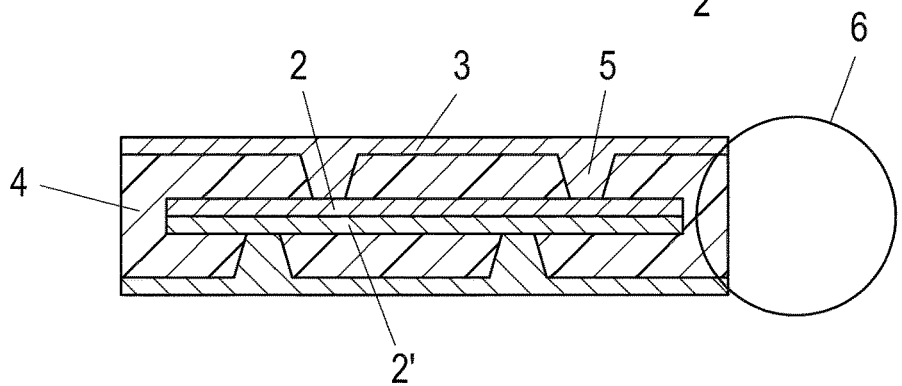
Figure 1F:
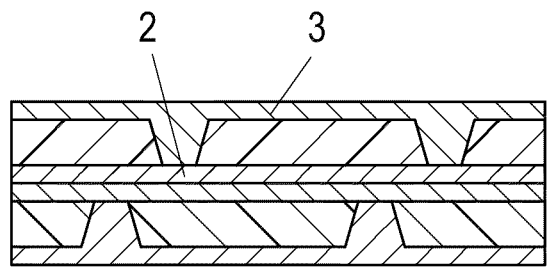
Figure 1G:
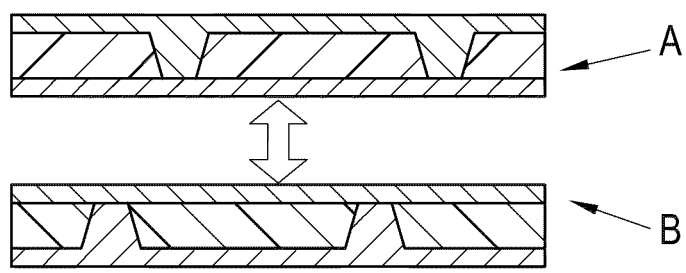

Subsequently, the semi-finished product is subjected to copper plating and via filing (FIG. 1e)) as further exemplary processing steps to provide exemplary electrical functionality to the printed circuit boards to be produced. The step depicted in FIG. 1f) is the step of cutting through the separation area formed by outer layers 2 and 2' along the edges thereof, so that the overlap of the insulating layers 4 and 4' surrounding the separation area is removed. Upon removal of this overlap, which overlap is highlighted in FIG. 1e) by the circle 6, the two groups of alternately applied conductive layers 2 and 3 and insulating layers 4 can easily be separated from each other as shown in FIG. 1g). The two printed circuit boards A and B thereby yielded can be further processed to form printed circuit boards of higher complexity. Additional conductive layers and insulating layers can be added by build-up and lamination methods known to the person skilled in the art.

FIG. 2 shows that the outer layer or the outer conductive layer 2 is smaller in area than the insulating layer 4 following the layer 2, so that the insulating layer 4 will overlap a separation area that is formed by two layers 2 and 2' facing each other as shown in FIG. 1.

FIG. 3 shows that prior to the cutting step shown in FIG. 1g) additional conductive layers and insulating layers 3 and 4 can be built-up with known methods of printed circuit board-production. In this example all insulating layers overlap the separation area and thus seal the separation area from leakage of chemicals into this area.

FIG. 4 depicts a preferred variant of the present invention in which a carrier layer 7 is arranged between the outer layers 2 and 2' facing each other. This build-up can be processed to yield the inventive semi-finished product and in particular according to the process steps described in relation to FIG. 1.

The invention claimed is:

1. A method for the production of connection systems for electronic components, the method comprising:
orienting two groups (A, B) of alternately applied conductive layers (3) and insulating layers (4, 4') within each of the two groups (A, B) with first layers (2, 2') facing each other, which first layers (2, 2') form a separation area where the groups (A, B) are to be separated from each other to yield connection systems for electronic systems, wherein the first layers (2, 2') are conductive, a layer of one or more polyimide foils that do not stick to the first layers (2, 2') is arranged on an inward-facing side of each of the first layers (2, 2') in the separation area and the first layers (2, 2') are closely held directly against the layer of one or more polyimide foils without directly bonding one of the first layers (2) to another of the first layers (2'), wherein the conductive layers (3), insulating layers (4, 4'), and first layers (2, 2') are applied symmetrically about the separation area;

safeguarding that the separation area is overlapped and sealed on all sides thereof by the two insulating layers (4, 4') adjacent to the separation area, alone or in combination with other layers in the separation area;

processing the groups (A, B) of alternately applied conductive layers (3) and insulating layers (4, 4'); and cutting through the separation area along the edges thereof allowing the two groups (A, B) of alternately applied conductive layers and insulating layers to be separated in a way that they fall apart when the overlapped insulating layers (4, 4') following the separation area are removed.

2. The method according to claim 1, wherein the insulating layers (4, 4') are made from prepreg-material.

3. The method according to claim 1, wherein the insulating layers (4, 4') each have a thickness between 10 µm and 80 µm.

4. The method according to claim 1, wherein at least one of the conductive layers (3) is structured for connection of electronic components.

5. The method according to claim 1, wherein the groups (A, B) each are formed by an odd number of conductive layers (3).

6. A semi-finished product for the production of connection systems for electronic components, the semi-finished product comprising:

two groups (A, B) of alternately applied conductive layers (3) and insulating layers (4, 4') within each of the two groups (A, B), wherein first layers (2, 2') of each group (A, B) are facing each other to form a separation area where the groups (A, B) are to be separated from each other to yield connection systems for electronic components, wherein the conductive layers (3) and insulating layers (4, 4') are applied symmetrically on an outward-facing side of each of the first layers (2, 2'), wherein the first layers (2, 2') are conductive, a layer of one or more polyimide foils that do not stick to the first layers (2, 2') is arranged on an inward-facing side of each of the first layers (2, 2') in the separation area, and the first layers (2, 2') are held directly against the layer of one or more polyimide foils without directly bonding one first layer (2) to the other first layer (2'), and wherein the separation area is overlapped and sealed on all sides thereof by the two insulating layers (4, 4') adjacent to the separation area, alone or in combination with other layers in the separation area.

7. The semi-finished product according to claim 6, wherein the insulating layers (4, 4') are made from prepreg-material.

8. The semi-finished product according to claim 7, wherein the prepreg-material is FR-4-material.

9. The semi-finished product according to claim 6, wherein the insulating layers (4, 4') each have a thickness between 10 µm and 80 µm.

10. The semi-finished product according to claim 6, wherein at least one of the conductive layers (3) is structured for connection of electronic components.

11. The semi-finished product according to claim 6, wherein the groups (A, B) each are formed by an odd number of conductive layers (3).

12. A printed circuit board comprising at least one semi-finished product according to claim 6.

* * * * *